(12) United States Patent
Wong et al.

(10) Patent No.: US 10,395,904 B2
(45) Date of Patent: *Aug. 27, 2019

(54) METHOD OF REAL TIME IN-SITU CHAMBER CONDITION MONITORING USING SENSORS AND RF COMMUNICATION

(71) Applicant: Applied Materials, Inc., Santa Clara, CA (US)

(72) Inventors: Lawrence Wong, San Jose, CA (US); Kartik Ramaswamy, San Jose, CA (US); Yang Yang, Los Gatos, CA (US); Steven Lane, Porterville, CA (US); Richard Fovell, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,297

(22) Filed: Nov. 21, 2018

(65) Prior Publication Data

US 2019/0096641 A1 Mar. 28, 2019

Related U.S. Application Data

(63) Continuation of application No. 14/460,640, filed on Aug. 15, 2014, now Pat. No. 10,141,166.

(51) Int. Cl.
*G06F 19/00* (2018.01)
*H01J 37/32* (2006.01)
*H01L 21/67* (2006.01)
*C23F 1/00* (2006.01)
*H01L 21/677* (2006.01)

(52) U.S. Cl.
CPC .. *H01J 37/32935* (2013.01); *H01J 37/32082* (2013.01); *H01J 37/32926* (2013.01); *H01L 21/67253* (2013.01); *C23F 1/00* (2013.01); *H01J 37/32917* (2013.01); *H01L 21/677* (2013.01)

(58) Field of Classification Search
CPC .......... H01J 37/32935; H01J 37/32009; H01J 37/32082; H01J 37/32926; H01J 37/32917; H01L 21/67253; H01L 21/31144; H01L 21/677; B01L 3/5027; F24F 11/0086; B01J 19/088; C23F 4/00; C23F 1/00
See application file for complete search history.

(56) References Cited

U.S. PATENT DOCUMENTS

| 2004/0007326 | A1* | 1/2004 | Roche | ............... H01J 37/32935 156/345.24 |
| 2004/0247522 | A1* | 12/2004 | Mills | ...................... B01J 19/088 423/648.1 |
| 2005/0151544 | A1* | 7/2005 | Mahoney | .......... H01J 37/32935 324/655 |
| 2005/0252984 | A1 | 11/2005 | Ahmed | |
| 2005/0284570 | A1* | 12/2005 | Doran | ....................... C23F 4/00 156/345.24 |

(Continued)

*Primary Examiner* — Tuan A Vu
(74) *Attorney, Agent, or Firm* — Fish & Richardson P.C.

(57) ABSTRACT

Plural sensors on an interior surface of a reactor chamber are linked by respective RF communication channels to a hub inside the reactor chamber, which in turn is linked to a process controller outside of the chamber.

15 Claims, 4 Drawing Sheets

(56) References Cited

U.S. PATENT DOCUMENTS

| | | | |
|---|---|---|---|
| 2007/0292941 A1* | 12/2007 | Handique | B01L 3/5027 |
| | | | 435/288.7 |
| 2008/0277062 A1* | 11/2008 | Koshimizu | H01J 37/32082 |
| | | | 156/345.28 |
| 2009/0196801 A1 | 8/2009 | Mills | |
| 2010/0151687 A1* | 6/2010 | Dhindsa | H01J 37/32009 |
| | | | 438/710 |
| 2011/0035043 A1 | 2/2011 | Liu | |
| 2015/0087154 A1* | 3/2015 | Guha | H01L 21/31144 |
| | | | 438/703 |

* cited by examiner

METHOD OF REAL TIME IN-SITU CHAMBER CONDITION MONITORING USING SENSORS AND RF COMMUNICATION

CROSS-REFERENCE TO RELATED APPLICATION

This application is a continuation of U.S. application Ser. No. 14/460,640, filed Aug. 15, 2014, the disclosure of which is incorporated by reference.

BACKGROUND

Technical Field

The disclosure concerns a chamber for processing a workpiece, and a method of monitoring conditions inside the chamber with multiple sensors linked to a process controller by radio frequency (RF) communication channels.

Background Discussion

A reactor chamber for processing a workpiece is typically vacuum-sealed during processing. A process controller external of the chamber controls process parameters, such as gas flow rates, plasma source power level, heater currents, electrostatic chucking voltage, vacuum pumping rate, coolant flow rate, as some examples. Process conditions are difficult to ascertain, generally because the sensors must be located so as to be accessible to signal-carrying wires while not interfering with plasma processing. As a result, during processing, there may be little or no sensing of internal chamber conditions communicated to the process controller. This prevents real time feedback control of chamber conditions by the process controller.

SUMMARY

A method is provided for processing a workpiece in a chamber of a reactor having a process controller outside of the chamber and governing process parameters in the chamber. The method comprises providing plural wireless sensors distributed across one or more internal surfaces of the chamber, providing a radio frequency (RF) communication hub inside the chamber and establishing respective independent RF communication channels between respective ones of the sensors and the RF communication hub, providing a communication path between the RF communication hub and the process controller, and communicating measurements from respective ones of the sensors to the process controller through respective ones of the RF communication channels.

In one embodiment, communicating comprises repetitively sampling all measurements from a group of the sensors within a sampling time window less than one second.

In one embodiment, the communication path comprises a wire conductor. In another embodiment, providing the communication path between the RF communication hub and the process controller comprises providing an external wireless communication receiver outside of the chamber and establishing an RF communication channel between the external wireless communication receiver and the RF communication hub.

In one embodiment, the providing a communication path between the RF communication hub and the process controller further comprises providing an RF window in a wall of the chamber.

In one embodiment, the method further comprises changing process parameters under control of the process controller to conform outputs of selected ones of the sensors to desired values. In this embodiment, the process parameters comprise one or more of: AC heater power, RF power supplied to an RF power applicator, coolant flow rate electrostatic chucking voltage and electrical power applied to a lift servo. Further in this embodiment, the selected ones of the sensors comprise at least one of a temperature sensor, a voltage sensor, a current sensor, a lift servo position sensor and an optical sensor.

In accordance with a further aspect, a reactor for processing a workpiece comprises a chamber, a process controller outside of the chamber and connected to the chamber to govern process parameters in the chamber, plural wireless sensors distributed across one or more internal surfaces of the chamber, a radio frequency (RF) communication hub programmed to maintain respective independent RF communication channels between respective ones of the sensors and the RF communication hub, and a communication path between the RF communication hub and the process controller. In one embodiment, the process controller is programmed to repetitively sample all measurements from a group of the sensors within a sampling time window less than one second. In one embodiment, the communication path between the RF communication hub and the process controller comprises an external wireless communication receiver outside of the chamber, and an RF communication channel between the external wireless communication receiver and the RF communication hub. The reactor may further comprise an RF window in a wall of the chamber. In one embodiment, the process controller is programmed to vary at least selected ones of the process parameters to conform outputs of selected ones of the sensors to desired values. In one embodiment, the process parameters comprise one or more of: AC heater power, RF power supplied to an RF power applicator, coolant flow rate electrostatic chucking voltage and electrical power applied to a lift servo. The selected ones of the sensors may comprise at least one of: a temperature sensor, a voltage sensor, a current sensor, a lift servo position sensor and an optical sensor.

In another aspect, a method is provided for processing a workpiece in a chamber of a reactor having a process controller outside of the chamber and governing process parameters in the chamber. The method comprises providing plural wireless sensors inside the chamber, providing a first radio frequency (RF) communication hub inside the chamber and establishing a first group of individual RF communication channels between a first group of individual ones of the plural wireless sensors, respectively, and the first RF communication hub, and providing a communication path between the first RF communication hub and the process controller. This method may further comprise providing a second radio frequency (RF) communication hub inside the chamber and establishing a second group of individual RF communication channels between a second group of individual ones of the plural wireless sensors, respectively, and the second RF communication hub, and providing a communication path between the second RF communication hub and the process controller.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
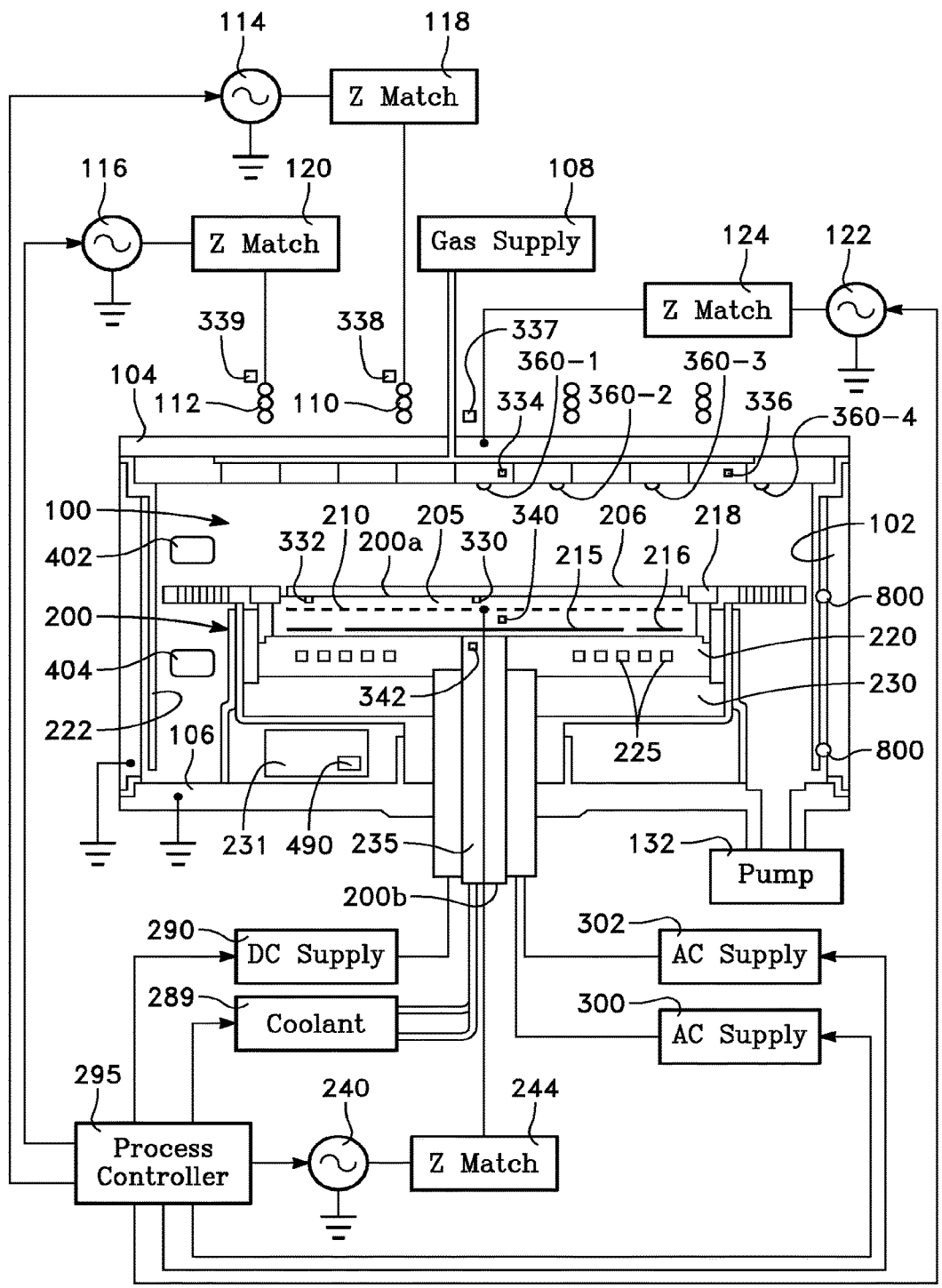
FIG. 1 is a simplified diagram of a reactor for processing a workpiece in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring to FIG. 1, a plasma reactor has a chamber 100 defined by a cylindrical sidewall 102, a ceiling 104 and a floor 106 whose peripheral edge meets the sidewall 102. The ceiling 104 may be a gas distribution plate that receives process gas from a process gas supply 108. Plasma source power may be inductively coupled or capacitively coupled into the chamber 100.

For example, in the case of inductive coupling of RF plasma source power, respective inner and outer coil antennas 110, 112 are connected to respective RF power generators 114, 116 through respective RF impedance match elements 118, 120. In this case, the ceiling or gas distribution plate 104 may be formed of a non-conductive material in order to permit inductive coupling of RF power from the coil antennas 110, 112 through the ceiling 104 and into the chamber 100.

In the case of capacitive coupling of RF plasma source power, the coil antennas 110 and 112 are not present, and the ceiling 104 is a conductive electrode. An RF power generator 122 is coupled through an impedance match 124 to the ceiling 104. Generally, the sidewall 102 and the floor 106 may be formed of metal and connected to ground. A vacuum pump 132 evacuates the chamber 100 through the floor 106. To maintain a vacuum, the chamber 100 is sealed.

A workpiece support pedestal 200 is provided inside the chamber 100 and has a top workpiece support surface 200a and a bottom end 200b below the floor 106, and an axial stem 235 extending upwardly from the bottom end 200b and through the floor 106.

The pedestal 200 includes a disk-shaped insulating puck 205 forming the top workpiece support surface 200a. The puck 205 contains an internal electrostatic chucking (ESC) electrode 210 close to the top workpiece support surface 200a. The puck 205 also contains inner and outer heating elements 215, 216, which may be electrical. Underlying the puck 205 is a disk-shaped metal base 220, which may be formed of aluminum. The top workpiece support surface 200a is the top surface of the puck 205 for supporting a workpiece 206 such as a semiconductor wafer. Internal coolant passages 225 are provided in the metal base 220. A disk-shaped insulator or planar insulator layer 230 underlies the metal base 220, and may be formed of a silicon dioxide or silicon nitride material, for example. A lift servo 231 may be provided for adjusting the axial height of the pedestal 200.

An RF power generator 240 is coupled through an impedance match 244 to the ESC electrode 210 to apply RF bias power. Alternatively, the RF bias generator may be coupled to the metal base 220.

A process ring 218 overlies the edge of the puck 205. The process ring 218 may be formed of a semiconductor material such as crystalline silicon. A chamber liner 222 may be provided on or adjacent the interior surface of the side wall 102.

A coolant supply 289 is coupled to the internal coolant passages 225. A D.C. workpiece clamping voltage source 290 is coupled to the ESC electrode 210. The inner and outer heating elements 215 and 216 are connected to respective AC power supplies 300 and 302.

A process controller 295 controls some or all of the components of the reactor of FIG. 1. The components governed by the process controller 295 can include the process gas supply 108, the AC power supplies 300 and 302, the D.C. workpiece clamping voltage source 290, the coolant supply 289, and one or more of the RF power generators 114, 116, 122 and 240. The process controller 295 performs such control in response to plural sensors located at different locations in the reactor of FIG. 1. The sensors to which the controller 295 responds may include one or more of the following: an inner zone temperature sensor 330 near the center of the workpiece support surface 200a, an outer zone temperature sensor 332 near the periphery of the workpiece support surface 200a, an inner zone temperature sensor 334 near the center of the ceiling 104 and an outer zone temperature sensor 336 near the periphery of the ceiling 104, a voltage sensor 337 at the ceiling 104, current sensors 338, 339 at the coil antennas 110, 112 respectively, and one or more voltage sensors 340, 342 at or near the ESC electrode 210. Optionally, a group of sensors 360-1, 360-2, 360-3 and 360-4 is distributed across an internal surface of the ceiling 104. The sensors 360-1, 360-2, 360-3 and 360-4 may be of any type (voltage sensors, current sensors, temperature sensors or optical sensors). They may each sense plasma ion density (or another parameter), in which case the group of sensors 360-1, 360-2, 360-3 and 360-4 provides an instantaneous sample of distribution of the parameter (e.g., plasma ion density distribution).

Figure 2:
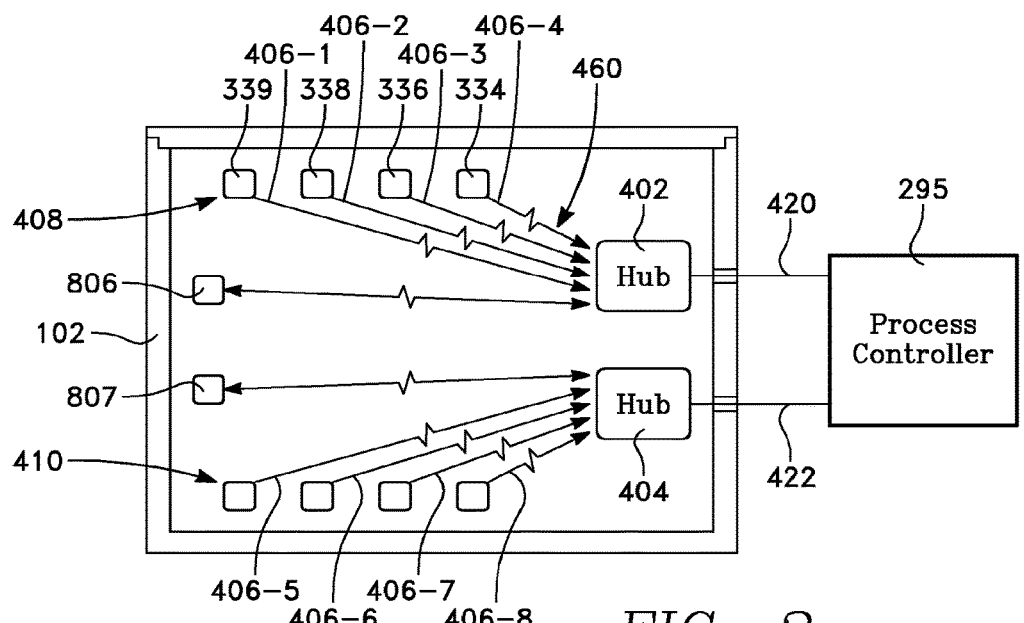
FIG. 2 is a block diagram of a first embodiment of a multi-channel RF communication system in the plasma reactor of FIG. 1.

Communication between the process controller 295 and any or all of the sensors may be provided through wireless RF communication channels extending to individual sensors. For this purpose, each sensor is a package that includes a sensor element and a wireless communication element, as will be described below. The sensor package may also include a source of electric power such as a battery. In one embodiment, the wireless RF communication channels may be implemented as a conventional wireless communication system, such as a spread spectrum communication system. The wireless communication system can include one or more wireless communication hubs 402, 404. Each one of the wireless communication hubs 402, 404 is linked via individual ones of a group of RF communication channels 460 to individual ones of the sensors. For example, as depicted in FIG. 2, the wireless communication hub 402 communicates with one group 408 of the sensors via individual RF communication channels 406-1, 406-2, 406-3 and 406-4. As depicted in FIG. 2, the group 408 of sensors may include, for example, the temperature sensors 334 and 336, and the current sensors 338 and 339. Another wireless communication hub 404 may communicate with another group 410 of sensors via individual RF communication channels 406-5, 406-6, 406-7 and 406-8. Each wireless communication hub 402, 404 may communicate with groups of sensors in respective zones of the reactor. For example, the first group 408 may include sensors at or near the ceiling 104 while the second group 410 may include sensors in or on the pedestal 200.

Various types of well-known spread spectrum systems, (such as code division multiple access systems) can implement the individual RF communication channels including the RF communication channels 406-1 through 406-8. All of the RF communication channels may provide concurrent independent communication between the process controller 295 and the sensors. The RF frequency of the RF communication channels may be 2.4 GHz (or any frequency in the ISM band), facilitating a high rate of information flow through the RF communication channels. For example, the process controller 295 may repetitively sample outputs of a large number of sensors (e.g., twenty sensors) once every sampling period. The sampling period may be less than one second, for example.

Figure 3:
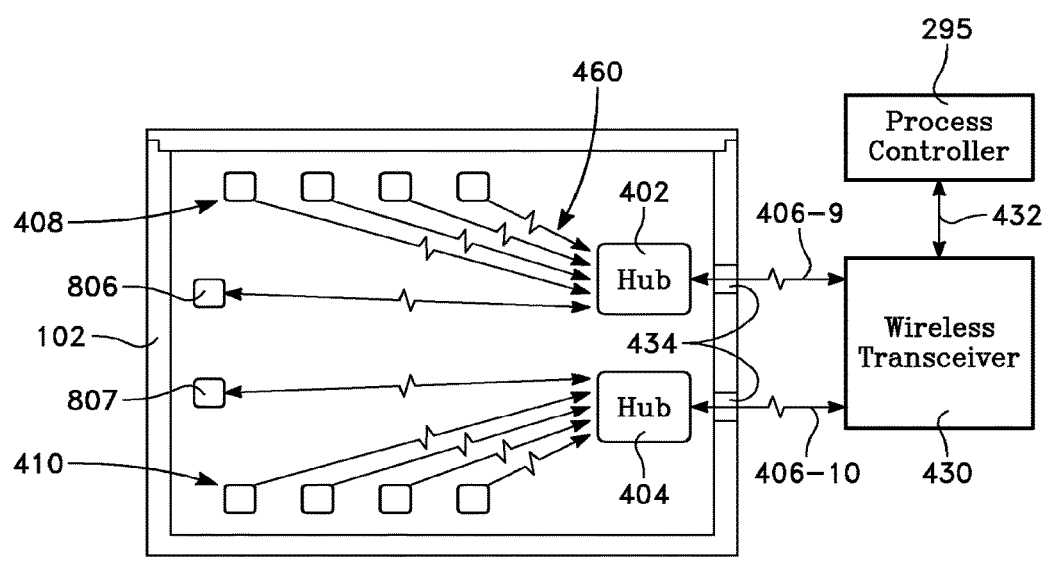
FIG. 3 is a block diagram of a second embodiment of a multi-channel RF communication system in the plasma reactor of FIG. 1.

In one example, in the embodiment of FIG. 2, each wireless communication hub 402, 404 communicates with the process controller 295 over wire conductors 420, 422 that extend through sealed openings in a wall of the chamber 100 such as the side wall 102. In the embodiment of FIG. 2, electric power from a source outside of the chamber 100 may be supplied to each communication hub 402, 404 through the conductors 420, 422. In the embodiment of FIG. 3, each wireless communication hub 402, 404 communicates over RF communication channels 406-9, 406-10 to an external wireless transceiver 430 outside of the chamber 100. In the embodiment of FIG. 3, each communication hub 402, 404 may include its own battery for electric power. The external wireless transceiver 430 is connected by a wire conductor 432 to the process controller 295. In many examples, the chamber enclosure including the side wall 102 and the ceiling 104 are conductive, and therefore block RF communication. To overcome this problem, one or more RF windows 434 (e.g., quartz windows) are provided in the chamber enclosure (e.g., in the side wall 102) to enable RF communication between each wireless communication hub 402, 404 and the external wireless transceiver 430.

Figure 4:
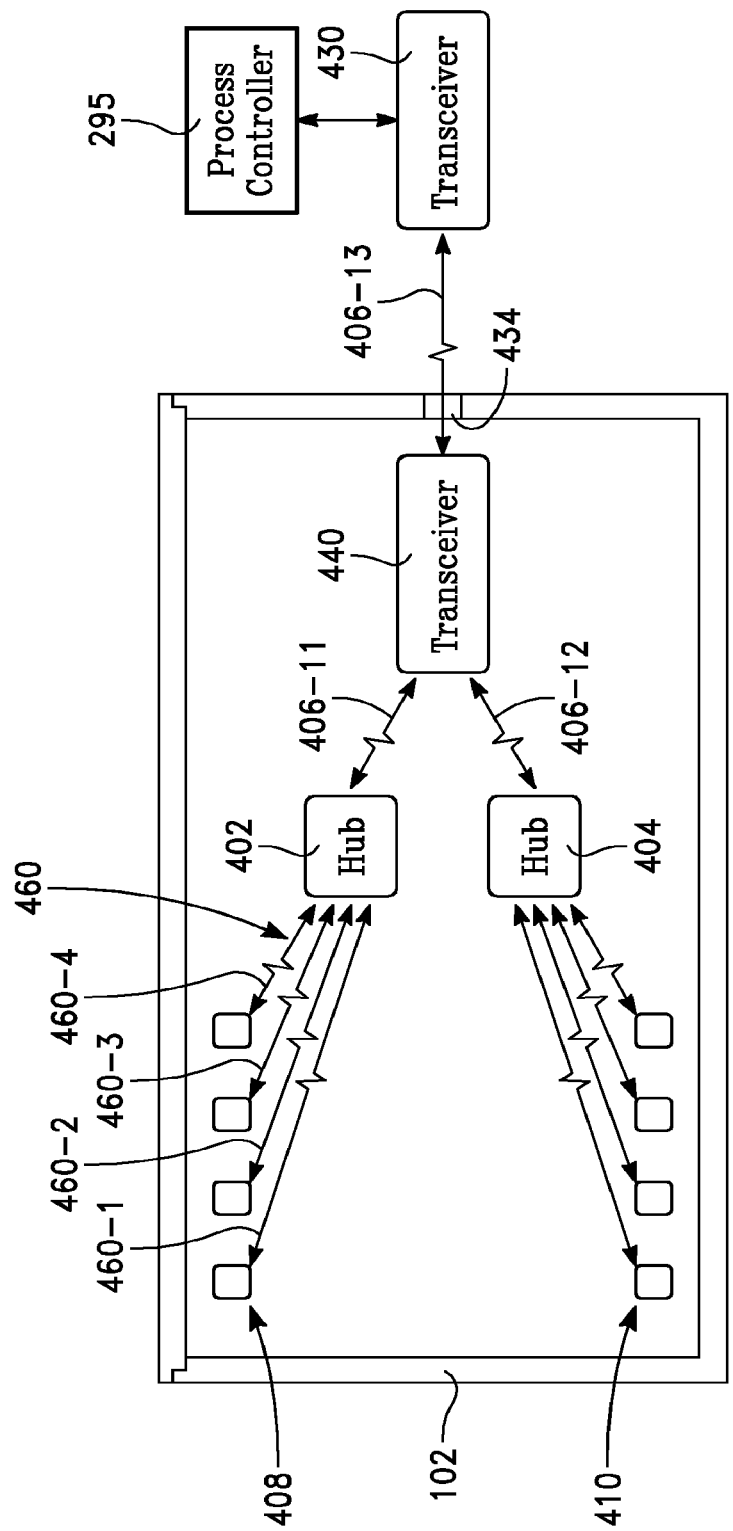
FIG. 4 is a block diagram of a third embodiment of a multi-channel RF communication system in the plasma reactor of FIG. 1.

FIG. 4 depicts an embodiment in which the wireless communication hubs 402 and 404 communicate with an internal wireless transceiver 440 inside the chamber via RF communication channels 406-11 and 406-12, and the internal wireless transceiver 440 communicates with the external wireless transceiver 430 through the RF window 434 via an RF communication channel 406-13.

The wireless communication hub 402 may receive data or signals from the group 408 of sensors in rapid succession (or in parallel) via the RF communication channels 406-1, 406-2, 406-3 and 406-4, and then organize the data into a serial stream of data from the entire group 408 that is compatible with the process controller 295. The wireless communication hub 402 may transmit this serial stream of data via the RF communication channel 406-9 to the external wireless transceiver 430, from which the serial stream of data reaches the process controller 295. Signal flow between the process controller 295 and the group 408 of sensors may be bi-directional. For example, FIG. 2 indicates bi-directional signal flow between the communication hubs 402, 404 and wireless sensors 806, 807. This may allow the process controller 295 to send commands to a wireless sensor 806 or 807 to control its performance. In one embodiment, each sensor may transmit its data in response to a request transmitted by the process controller 295 over any of the RF communication channels 406-1, 406-2, 406-3 and 406-4 to the sensor. Such a request may identify the particular sensor by its device address, for example. In this manner, the process controller 295 may poll each of the sensors in a desired order, for example. The process controller 295 may be programmed to repetitively sample all measurements from a group of the wireless sensors or all of the wireless sensors.

Figure 5:
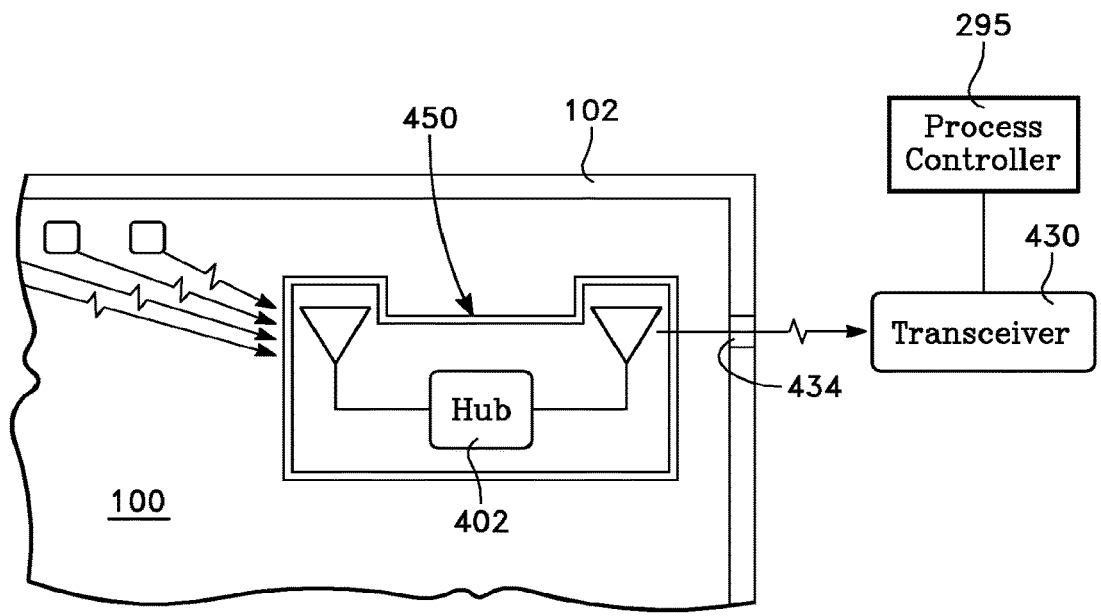
FIG. 5 is a simplified diagram depicting a wireless communication hub in the multi-channel communication system of FIG. 2 or 3.

FIG. 5 depicts an embodiment in which the wireless communication hub 402 is protected from plasma by a dielectric (quartz) envelope 450.

Figure 6:
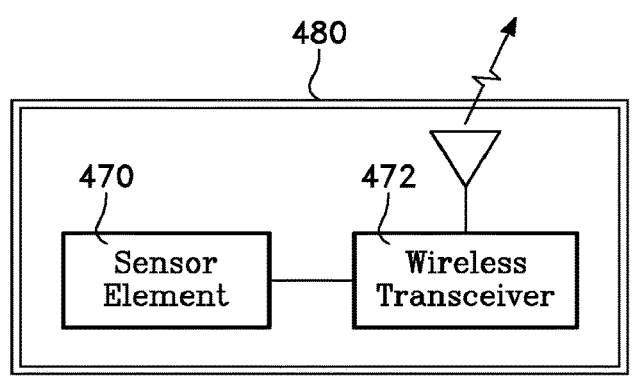
FIG. 6 is a simplified diagram of a wireless sensor in the multi-channel communication system of any of FIGS. 2-5.

FIG. 6 depicts one embodiment of a wireless sensor, which may be any one of the sensors referred to above. The wireless sensor consists of a sensor element 470 (e.g., a temperature sensor, a voltage sensor or a current sensor), connected to a wireless transceiver 472. The wireless transceiver 472 communicates with one of the wireless communication hubs 402 or 404 via a wireless communication channel. The wireless sensor of FIG. 6 may be contained in a dielectric (e.g., quartz) envelope 480 for protection. Another way to protect the wireless sensors is to locate them in a gap between the side wall 102 and the chamber liner 222. For example, FIG. 1 depicts wireless sensors 800 placed between the side wall 102 and the chamber liner 222. The chamber liner 222 may be formed of a material that does not block RF communication.

Referring again to FIG. 1, the lift servo 231 may be provided with a wireless communication transceiver 490 through which control commands may be received. The wireless communication transceiver 490 communicates through one of the wireless communication hubs 402 or 404 via a wireless communication channel. This allows the communication of commands from the process controller 295 to the lift servo 231. The lift servo 231 may include a conventional servo position sensor, which may be connected to the wireless communication transceiver 490, for transmission of lift servo position data on the wireless communication channel of the wireless communication transceiver 490.

The process controller 295 may be programmed to implement a feedback control loop by controlling process parameters of the chamber 100 to conform outputs of selected ones of said sensors to predetermined values. For example, the process controller 295 may change the power applied to a heater in the workpiece support pedestal in response to data received from a wireless temperature sensor near a component affected by the heater. The process parameters may include one or more of: AC heater power, RF power supplied to an RF power applicator, coolant flow rate electrostatic chucking voltage and electrical power applied to a lift servo. The selected sensors may include one or more of a temperature sensor, a voltage sensor, a current sensor, a lift servo position sensor and an optical sensor.

Advantages:

Various advantages are provided in the foregoing embodiments. For example, any number of sensors may be distributed within the chamber 100, and their outputs communicated to the process controller 295 after the chamber is closed or sealed. This enables real-time feedback control by the process controller 295. The sensor locations are not restricted by any need for wire access, so that sensors may be placed at any one of a broad range of locations in the chamber. As a result, a correspondingly large range of chamber conditions may be monitored and/or included in feedback control by the process controller 295. The foregoing embodiments may be used with or without plasma present in the chamber 100.

While the foregoing is directed to embodiments of the present invention, other and further embodiments of the invention may be devised without departing from the basic scope thereof, and the scope thereof is determined by the claims that follow.

What is claimed is:

1. A method of processing a workpiece in a chamber of a reactor having a process controller outside of the chamber and governing process parameters in the chamber, comprising:
    activating placement of a workpiece into the chamber so that the workpiece rests on a support;
    monitoring the workpiece using plural sensors which are secured to the chamber and fixed in locations inside the chamber, each sensor having a wireless transceiver;
    establishing respective independent wireless communication channels between a wireless communication hub inside the chamber and respective wireless transceivers of the plural sensors;
    transmitting measurements by each respective sensor from the wireless transceiver of the respective sensor to the wireless communication hub; and
    transmitting the measurements from the wireless communication hub inside the chamber to the process controller outside the chamber.

2. The method of claim 1, comprising repetitively sampling outputs from a group of the sensors.

3. The method of claim 1, wherein transmitting the measurements from the wireless communication hub to the process controller comprises transmitting on a wire conductor through a wall of the chamber.

4. The method of claim 1, wherein transmitting the measurements from the wireless communication hub to the process controller comprises establishing a wireless communication channel between an external wireless communication receiver of the process controller and the wireless communication hub.

5. The method of claim 1, wherein transmitting the measurements from the wireless communication hub to the process controller comprises transmitting wireless signals through an RF window in a wall of the chamber.

6. The method of claim 5, wherein the wall of the chamber is conductive such that the chamber blocks wireless communication between respective at least some of the sensors and the process controller.

7. The method of claim 1, further comprising changing process parameters under control of the process controller to conform outputs of selected ones of the sensors to desired values.

8. The method of claim 7, wherein the process parameters comprise one or more of: AC heater power, RF power supplied to an RF power applicator, coolant flow rate electrostatic chucking voltage and electrical power applied to a lift servo.

9. The method of claim 8, wherein the plural sensors comprise at least one of a temperature sensor, a voltage sensor, a current sensor, a lift servo position sensor or an optical sensor.

10. The method of claim 1, wherein the locations comprise a workpiece support surface of the support.

11. The method of claim 1, wherein the locations comprise an interior of the support.

12. The method of claim 1, wherein the locations comprise a ceiling of the chamber.

13. The method of claim 1, wherein the wireless communication hub is a first wireless communication hub and the plural sensors are first plural sensors, and further comprising:
    monitoring the workpiece using second plural sensors secured to the chamber and fixed in locations inside the chamber, each sensor of the second plural sensors having a wireless transceiver;
    establishing respective independent wireless communication channels between a second wireless communication hub inside the chamber and respective wireless transceivers of the second plural sensors;
    transmitting measurements by each respective sensor of the second plural sensors from the wireless transceiver of the respective sensor of the second plural sensors to the second wireless communication hub; and
    transmitting the measurements from the second wireless communication hub inside the chamber to the process controller outside the chamber.

14. The method of claim 13, wherein transmitting the measurements from the first wireless communication hub to the process controller comprises transmitting on a first wire and transmitting the measurements from the second wireless communication hub to the process controller comprises transmitting on a second wire.

15. The method of claim 13, wherein transmitting the measurements from the first wireless communication hub to the process controller comprises wirelessly transmitting to a wireless communication receiver outside the chamber and transmitting the measurements from the second wireless communication hub to the process controller comprises wirelessly transmitting to the wireless communication receiver.

* * * * *